United States Patent
Kim et al.

(10) Patent No.: US 12,327,799 B2
(45) Date of Patent: Jun. 10, 2025

(54) SEMICONDUCTOR DEVICE AND METHOD OF FORMING MULTI-LAYER SHIELDING STRUCTURE WITH LAYERS OF FERROMAGNETIC MATERIAL, PROTECTIVE MATERIAL, LAMINATE MATERIAL OR CONDUCTIVE MATERIAL OVER THE SEMICONDUCTOR DEVICE

(71) Applicant: STATS ChipPAC Pte. Ltd., Singapore (SG)

(72) Inventors: ChangOh Kim, Incheon (KR); JinHee Jung, Incheon (KR); JiWon Lee, Seoul (KR); YuJeong Jang, Incheon (KR)

(73) Assignee: STATS ChipPAC Pte. Ltd., Singapore (SG)

( * ) Notice: Subject to any disclaimer, the term of this patent is extended or adjusted under 35 U.S.C. 154(b) by 42 days.

(21) Appl. No.: 17/317,082

(22) Filed: May 11, 2021

(65) Prior Publication Data

US 2022/0367381 A1 Nov. 17, 2022

(51) Int. Cl.
*H01L 23/552* (2006.01)
*H01L 21/56* (2006.01)
*H01L 23/532* (2006.01)
*H05K 1/02* (2006.01)

(52) U.S. Cl.
CPC ........... *H01L 23/552* (2013.01); *H01L 21/56* (2013.01); *H01L 23/53214* (2013.01); *H01L 23/53228* (2013.01); *H01L 23/53242* (2013.01); *H05K 1/0218* (2013.01)

(58) Field of Classification Search
CPC . H01L 23/552–556; H01L 23/28–3192; H01L 21/56–568; H01L 2924/181–186
See application file for complete search history.

(56) References Cited

U.S. PATENT DOCUMENTS

| | | | | |
|---|---|---|---|---|
| 4,459,680 A | * | 7/1984 | Sukeda | H05K 5/026 D14/438 |
| 5,561,265 A | | 10/1996 | Livshits et al. | |
| 5,639,989 A | * | 6/1997 | Higgins, III | H01L 23/552 174/394 |
| 9,269,673 B1 | * | 2/2016 | Lin | H01L 24/97 |

(Continued)

Primary Examiner — Laura M Menz
Assistant Examiner — Candice Chan
(74) Attorney, Agent, or Firm — Robert D. Atkins; PATENT LAW GROUP: Atkins and Associates, P.C.

(57) ABSTRACT

A semiconductor device has a substrate and electrical components disposed over the substrate. An encapsulant is disposed over the substrate and electrical components. A multi-layer shielding structure is formed over the encapsulant. The multi-layer shielding structure has a first layer of ferromagnetic material and second layer of a protective layer or conductive layer. The ferromagnetic material can be iron, nickel, nickel iron alloy, iron silicon alloy, silicon steel, nickel iron molybdenum alloy, nickel iron molybdenum copper alloy, iron silicon aluminum alloy, nickel zinc, manganese zinc, other ferrites, amorphous magnetic alloy, amorphous metal alloy, or nanocrystalline alloy. The first layer can be a single, homogeneous material. The protective layer can be stainless steel, tantalum, molybdenum, titanium, nickel, or chromium. The conductive layer can be copper, silver, gold, or aluminum. The multi-layer shielding structure protects the electrical components from low frequency and high frequency interference.

2 Claims, 8 Drawing Sheets

(56) References Cited

U.S. PATENT DOCUMENTS

| | | |
|---|---|---|
| 9,362,235 B2 | 6/2016 | Kim et al. |
| 9,997,468 B2 | 6/2018 | Han et al. |
| 10,388,611 B2 | 8/2019 | Cho et al. |
| 10,438,901 B1 * | 10/2019 | Krefft .................... H01L 23/08 |
| 2018/0261550 A1 * | 9/2018 | Cho ....................... H01L 43/10 |

* cited by examiner

SEMICONDUCTOR DEVICE AND METHOD OF FORMING MULTI-LAYER SHIELDING STRUCTURE WITH LAYERS OF FERROMAGNETIC MATERIAL, PROTECTIVE MATERIAL, LAMINATE MATERIAL OR CONDUCTIVE MATERIAL OVER THE SEMICONDUCTOR DEVICE

FIELD OF THE INVENTION

The present invention relates in general to semiconductor devices and, more particularly, to a semiconductor device and method of forming a multi-layer shielding structure over the semiconductor device.

BACKGROUND OF THE INVENTION

Semiconductor devices are commonly found in modern electronic products. Semiconductor devices perform a wide range of functions, such as signal processing, high-speed calculations, transmitting and receiving electromagnetic signals, controlling electronic devices, photo-electric, and creating visual images for television displays. Semiconductor devices are found in the fields of communications, power conversion, networks, computers, entertainment, and consumer products. Semiconductor devices are also found in military applications, aviation, automotive, industrial controllers, and office equipment.

Semiconductor devices, particularly in high frequency applications, such as radio frequency (RF) wireless communications, often contain one or more integrated passive devices (IPDs) to perform necessary electrical functions. The IPDs are susceptible to electromagnetic interference (EMI), radio frequency interference (RFI), harmonic distortion, or other inter-device interference, such as capacitive, inductive, or conductive coupling, also known as cross-talk, which can interfere with their operation. The high-speed switching of a digital circuit also generates interference.

Multiple semiconductor die and IPDs can be integrated into a system-in-package (SIP) module or other electronic device assembly for higher density in a small space and extended electrical functionality. Within the SIP module, semiconductor die and IPDs are mounted to a substrate for structural support and electrical interconnect. An encapsulant is deposited over the semiconductor die, IPDs, and substrate. A shielding layer is often formed over the encapsulant to isolate or block sensitive circuits from EMI, RFI, harmonic distortion, or other inter-device interference.

The electronic devices and modules can generate or be susceptible to high frequency and low frequency interference. High frequency interference is generally above 1.0 gigahertz (GHz), and low frequency interference is below 1.0 GHz. Low frequency interference can be generated by a magnetic field emitted from various sources, such as Qi-WPC compatible devices, near field communication (NFC) devices, radio frequency identification (RFID) devices, power matters alliance (PMA) compatible devices, alliance for wireless power (A4WP) compatible devices, wireless charging technology (WCT) devices, switching power supplies, inductor modules, and magnetic random access memory (RAM), as well as electromagnetic noise interference radiated by SiP or high density circuits operating at a high frequency. A high frequency shield can be made with conductive material coating, such as silver (Ag) or copper (Cu). However, most shielding materials are ineffective for low frequency interference, particularly from low frequency magnetic fields.

DETAILED DESCRIPTION OF THE DRAWINGS

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings. The term "semiconductor die" as used herein refers to both the singular and plural form of the words, and accordingly, can refer to both a single semiconductor device and multiple semiconductor devices.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, and resistors, create a relationship between voltage and current necessary to perform electrical circuit functions.

Back-end manufacturing refers to cutting or singulating the finished wafer into the individual semiconductor die and packaging the semiconductor die for structural support, electrical interconnect, and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with conductive layers, bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

Figure 1A:
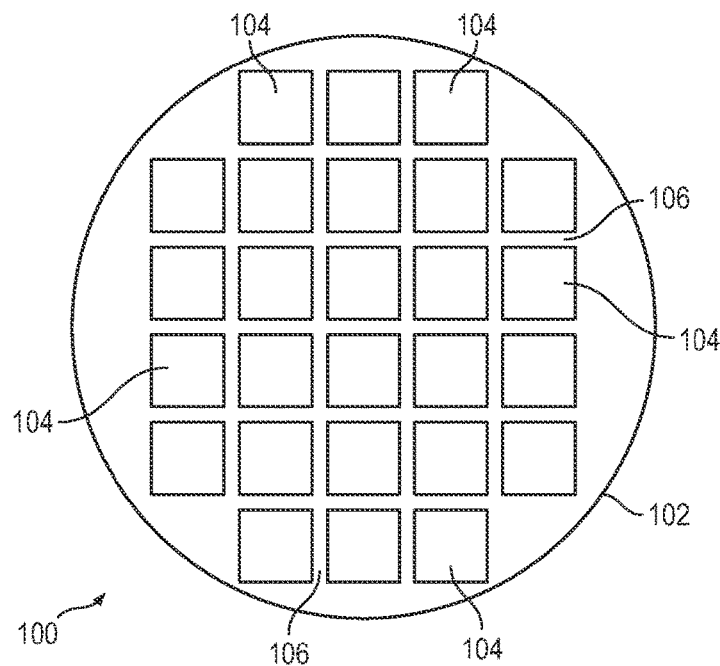
FIGS. 1a-1c illustrate a semiconductor wafer with a plurality of semiconductor die separated by a saw street.

FIG. 1a shows a semiconductor wafer 100 with a base substrate material 102, such as silicon, germanium, aluminum phosphide, aluminum arsenide, gallium arsenide, gallium nitride, indium phosphide, silicon carbide, or other bulk material for structural support. A plurality of semiconductor die or components 104 is formed on wafer 100 separated by a non-active, inter-die wafer area or saw street 106. Saw street 106 provides cutting areas to singulate semiconductor wafer 100 into individual semiconductor die 104. In one embodiment, semiconductor wafer 100 has a width or diameter of 100-450 millimeters (mm).

Figure 1B:
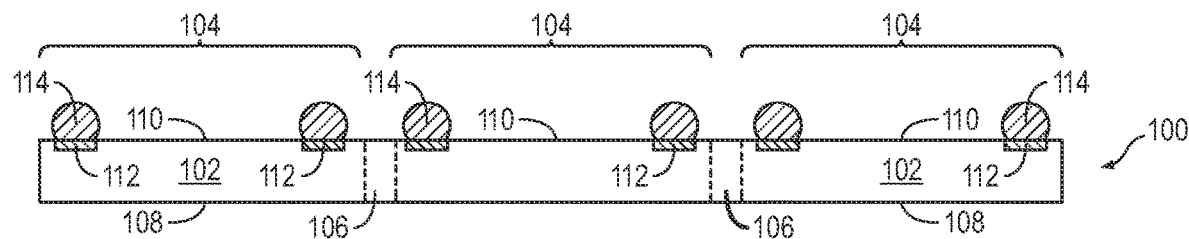

FIG. 1B shows a cross-sectional view of a portion of semiconductor wafer 100. Each semiconductor die 104 has a back or non-active surface 108 and an active surface 110 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 110 to implement analog circuits or digital circuits, such as digital signal processor (DSP), application specific integrated circuits (ASIC), memory, or other signal processing circuit. Semiconductor die 104 may also contain IPDs, such as inductors, capacitors, and resistors, for RF signal processing.

An electrically conductive layer 112 is formed over active surface 110 using PVD, CVD, electrolytic plating, electroless plating process, or other suitable metal deposition process. Conductive layer 112 can be one or more layers of aluminum (Al), Cu, tin (Sn), nickel (Ni), gold (Au), Ag, or other suitable electrically conductive material. Conductive layer 112 operates as contact pads electrically connected to the circuits on active surface 110.

An electrically conductive bump material is deposited over conductive layer 112 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 112 using a suitable attachment or bonding process. In one embodiment, the bump material is reflowed by heating the material above its melting point to form balls or bumps 114. In one embodiment, bump 114 is formed over an under bump metallization (UBM) having a wetting layer, barrier layer, and adhesive layer. Bump 114 can also be compression bonded or thermocompression bonded to conductive layer 112. Bump 114 represents one type of interconnect structure that can be formed over conductive layer 112. The interconnect structure can also use bond wires, conductive paste, stud bump, micro bump, or other electrical interconnect.

Figure 1C:
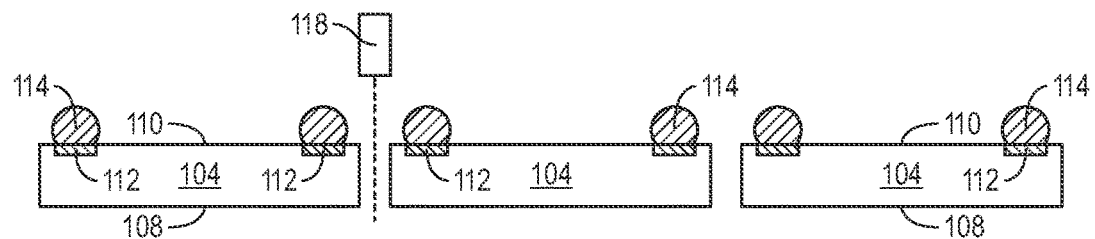

In FIG. 1c, semiconductor wafer 100 is singulated through saw street 106 using a saw blade or laser cutting tool 118 into individual semiconductor die 104. The individual semiconductor die 104 can be inspected and electrically tested for identification of KGD post singulation.

Figure 2A:
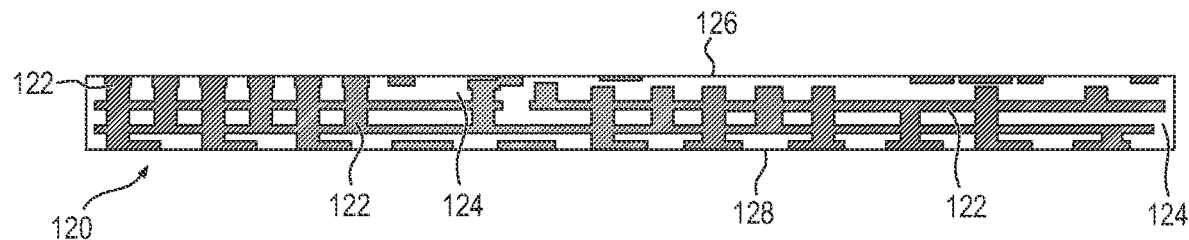
FIGS. 2a-2f illustrate a process of forming a multi-layer shield structure over an SIP module.

FIGS. 2a-2f illustrate a process of forming a multi-layer shielding structure effective against low frequency interference over an SIP module. FIG. 2a shows a cross-sectional view of interconnect substrate 120 including conductive layers 122 and insulating layer 124. Conductive layer 122 can be one or more layers of Al, Cu, Sn, Ni, Au, Ag, or other suitable electrically conductive material. Conductive layer 122 provides horizontal electrical interconnect across substrate 120 and vertical electrical interconnect between top surface 126 and bottom surface 128 of substrate 120. Portions of conductive layer 122 can be electrically common or electrically isolated depending on the design and function of semiconductor die 104 and other electrical components. Insulating layer 124 contains one or more layers of silicon dioxide (SiO2), silicon nitride (Si3N4), silicon oxynitride (SiON), tantalum pentoxide (Ta2O5), aluminum oxide (Al2O3), solder resist, polyimide, benzocyclobutene (BCB), polybenzoxazoles (PBO), and other material having similar insulating and structural properties. Insulating layer 124 provides isolation between conductive layers 122.

Figure 2B:
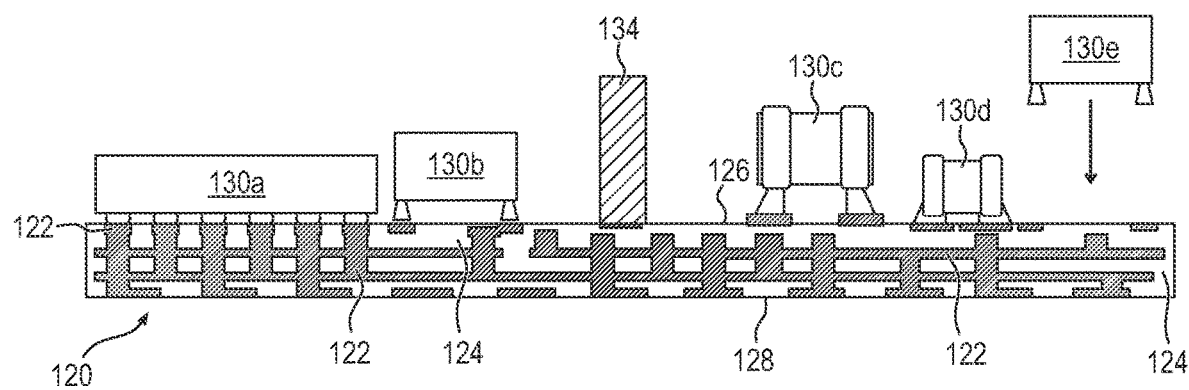

In FIG. 2b, a plurality of electrical components 130a-130e is mounted to surface 126 of interconnect substrate 120 and electrically and mechanically connected to conductive layers 122. Electrical components 130a-130e are each positioned over substrate 120 using a pick and place operation. For example, electrical components 130a can be semiconductor die 104 from FIG. 1c with active surface 110 and bumps 114 oriented toward surface 126 of substrate 120 and electrically connected to conductive layer 122. Electrical components 130a-130e can include other semiconductor die, semiconductor packages, surface mount devices, discrete electrical devices, discrete transistors, diodes, or IPDs, such as a resistor, inductor, or capacitor.

Figure 2C:
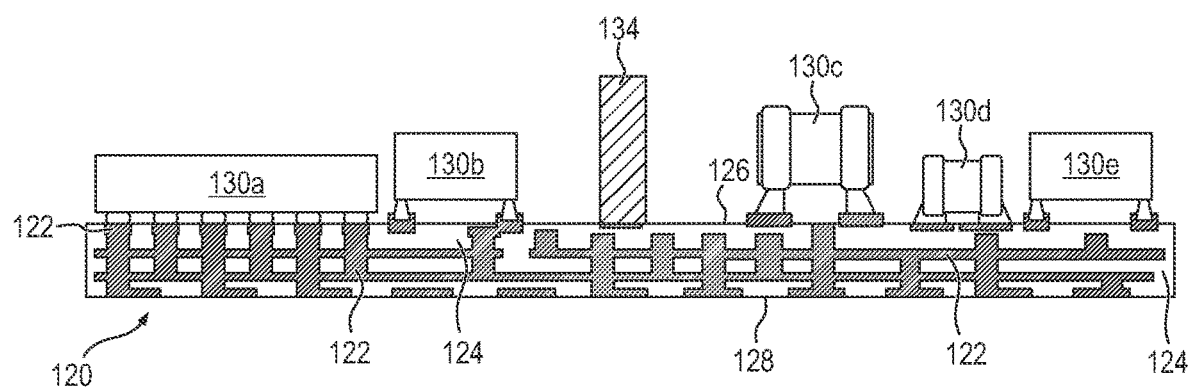

A conductive post or pillar 134 is formed on interconnect substrate 120 and electrically connected to conductive layer 122. Conductive post 134 can be used for vertical electrical interconnect. Alternatively, a plurality of conductive posts 134, or a conductive wall 134, provides electromagnetic shielding between electrical components 130a-103b and electrical components 130c-130e. FIG. 2c shows electrical components 130a-130e and conductive post 134 making mechanical and electrical connection to conductive layer 122 of interconnect substrate 120.

Figure 2D:
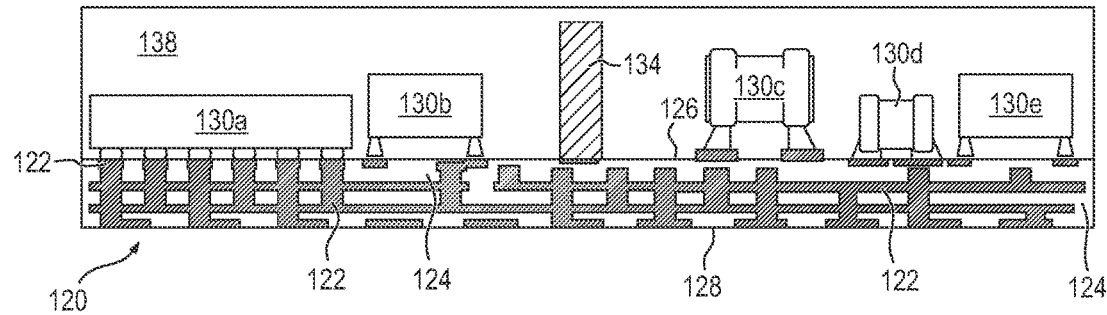

In FIG. 2d, an encapsulant or molding compound 138 is deposited over electric components 130a-103e, conductive post 134, and substrate 120 using a paste printing, compressive molding, transfer molding, liquid encapsulant molding, vacuum lamination, spin coating, or other suitable applicator. Encapsulant 138 can be polymer composite material, such as epoxy resin with filler, epoxy acrylate with filler, or polymer with proper filler. Encapsulant 138 is non-conductive, provides structural support, and environmentally protects the semiconductor device from external elements and contaminants.

Figure 2E:
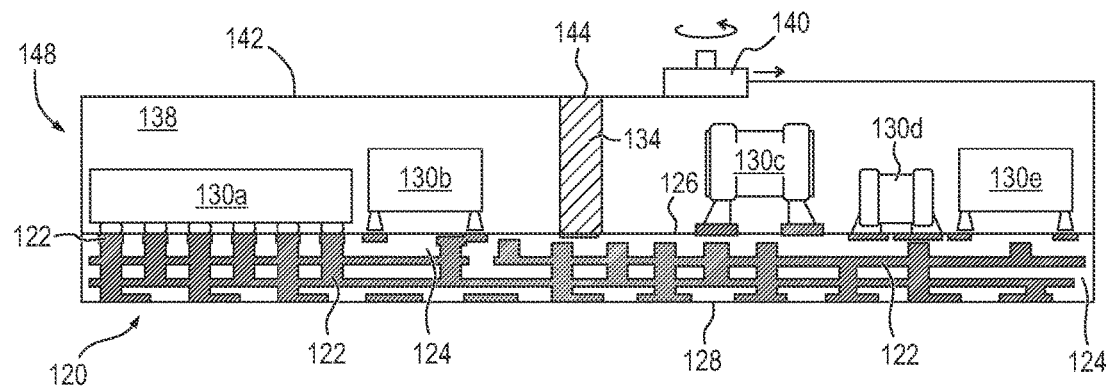

In FIG. 2e, a portion of encapsulant 138 can be removed by grinder 140 to expose surface 142 of the encapsulant and surface 144 of conductive post 134. Grinder 140 planarizes surface 142 of encapsulant 138 and surface 144 of conductive post 134. Electrical components 130a-130e and conductive post 134 mounted to conductive layer 122 of interconnect substrate 120 constitute SIP module or semiconductor component assembly 148.

Electrical components 130a-130e in SIP module 148 may contain IPDs that are susceptible to or generate EMI, RFI, harmonic distortion, and inter-device interference (collectively referred to as "interference"). For example, the IPDs contained within electrical components 130a-130e provide the electrical characteristics needed for high-frequency applications, such as resonators, high-pass filters, low-pass filters, band-pass filters, symmetric Hi-Q resonant transformers, and tuning capacitors. In another embodiment, electrical components 130a-130e contains digital circuits switching at a high frequency, which could interfere with the operation of IPDs in SIP module 148. Electrical components 130a-130e may generate low frequency interference from low frequency magnetic fields.

Figure 2F:
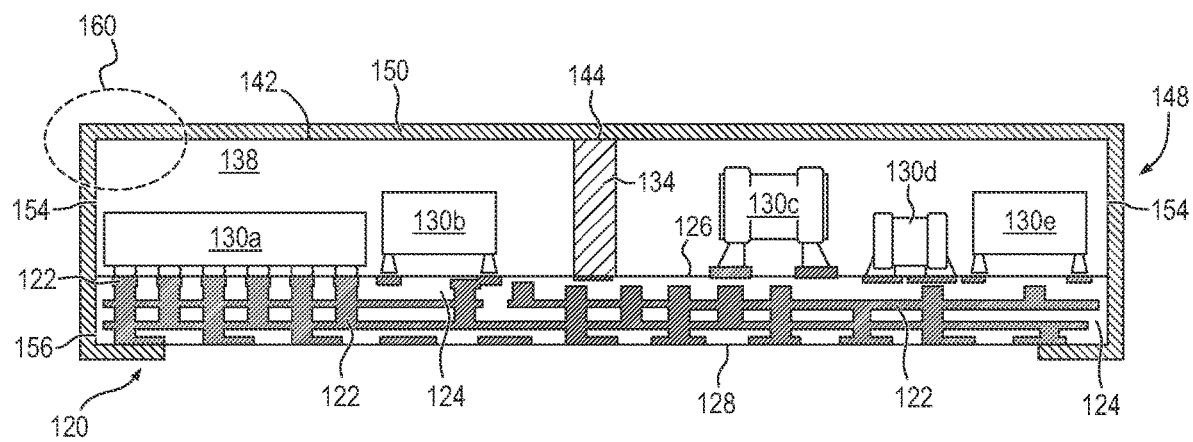

In FIG. 2f, an electromagnetic shield or shielding structure 150 is formed or disposed over top surface 142 of encapsulant 138 and surface 144 of conductive post 134.

Electromagnetic shield 150 also covers side surface 154 of encapsulant 138 and side surface 156 of interconnect substrate 120 and at least a portion of surface 128 of the interconnect substrate. Electromagnetic shield 150 is a multi-layer shielding structure covering SIP module 148, including top surface 142 and side surface 154 of encapsulant 138, making electrical contact with conductive post 134, and further covering side surface 156 of interconnect substrate 120 and at least a portion of bottom surface 128 of the interconnect substrate. The layers of electromagnetic shielding structure 150 are a combination of a protection layer, soft ferromagnetic (FM) layer, and high conductivity, low resistivity ($\sigma$) metal. The protection layer can be stainless steel or steel use stainless (SUS), tantalum (Ta), molybdenum (Mo), titanium (Ti), Ni, and chromium (Cr). The protection layer provides protection from the elements, as well as an adhesion property. The protection layer can be introduced as a protective, adhesion, or capping layer in the various shielding structures described in FIGS. 3a-3c and 3f.

The soft FM layer is made with material having a high magnetic permeability. The soft FM layer can be iron (Fe), Ni, nickel iron (NiFe) alloy, iron silicon (FeSi) alloy, silicon steel (Fe and carbon), nickel iron molybdenum (NiFeMo) alloy, nickel iron molybdenum copper (NiFeMoCu) alloy, iron silicon aluminum (FeSiAl) alloy, nickel zinc (NiZn), manganese zinc (MnZn), other ferrites, amorphous magnetic alloy, amorphous metal alloy, and nanocrystalline alloy. The soft FM layer can also be Fe or cobalt (Co) in combination with at least one of Ni, Cu, Mo, Mn, Si, Zn, Al, Cr, boron (B), niobium (Nb), phosphorus (P), zirconium (Zr), and combination thereof. In one embodiment, soft FM material is 72-82 wt. % Ni and 12-20 wt. % Fe. The soft FM layer can be a single, homogeneous, uniform composition of metal or materials, as described above. The high $\sigma$ metal can be Ag, Cu, Au, and Al.

Another type of layer can be a laminated spacer structure, i.e., multiple layers with one or more materials, including Ta, Mo, Ti, Cr, Cu, Al, Au, Ag, SiO2, Al2O3, Si3N4, AlN, and oxide-based semiconductors or insulators. The spacer can be laminated before or after soft FM layer lamination. The laminated spacer prevents out-of-plane magnetization caused by perpendicular anisotropy, suppressing eddy current effect. The laminated spacer can be formed by sputtering, spray, or wet plating to a thickness of 1.0 nanometers (nm) to 1.0 micrometers ($\mu$m).

The soft FM layer or high-$\sigma$ metal can be deposited or coated using PVD, spray, and wet plating. The thickness of each layer ranges from 1.0 nm-1.0 $\mu$m. Any number of layers of material can be used for electromagnetic shield 150. The soft FM layer can be deposited in a uniform aligning magnetic field applied parallel to the film plane or under RF or direct current (DC) bias applied to a substrate to induce a uniaxial magnetic anisotropy and reduce residual stresses. A variety of combinations of these layers and materials is within the spirit and scope of the invention.

Figure 3A:
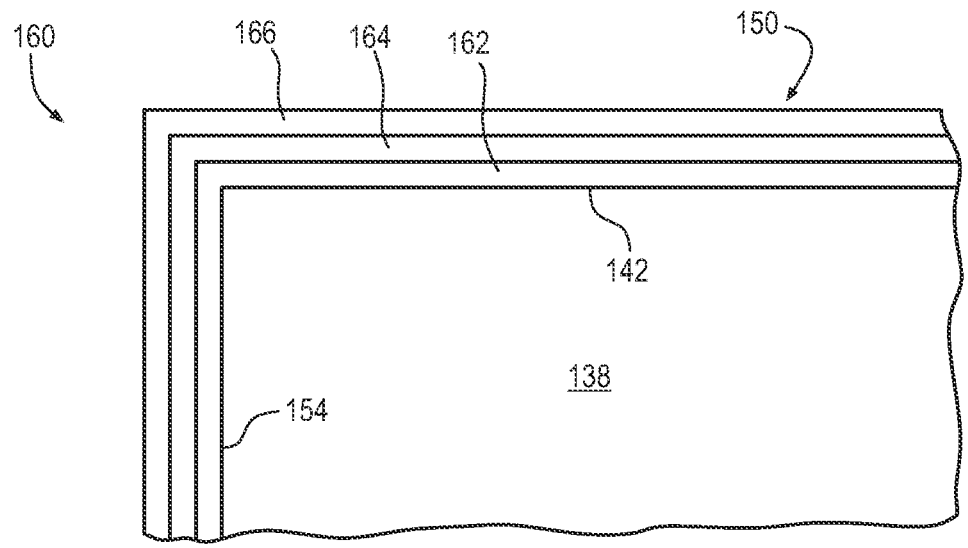
FIGS. 3a-3g illustrate various layer-by-layer embodiment of the multi-layer shielding structure.

FIG. 3a illustrates a first embodiment of a portion of multi-layer electromagnetic shield 150, in the area indicated by dashed line 160 in FIG. 2f. In the first embodiment, electromagnetic shielding structure 150 has three layers: a first layer 162 formed over and contacting surfaces 142, 144, 154, 156, and 128, second layer 164 formed over and contacting layer 162, and third layer 166 formed over and contacting layer 164. Layer 162 can be a protection layer, layer 164 can be a soft FM layer, and layer 166 can be a protection layer. These three identified layers of electromagnetic shield 150 are each disposed over the entirety of surfaces 142, 144, 154, and 156, and at least a portion of surface 128, in SIP module 148.

Figure 3B:
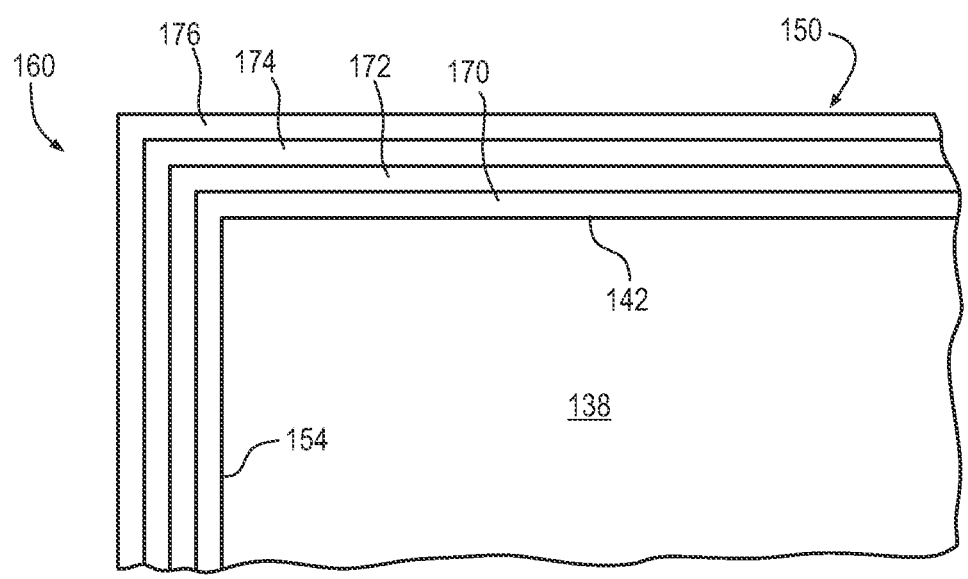

FIG. 3b illustrates a second embodiment of a portion of multi-layer electromagnetic shield 150, in the area indicated by dashed line 160. In the second embodiment, electromagnetic shielding structure 150 has four layers: a first layer 170 formed over and contacting surfaces 142, 144, 154, 156, and 128, second layer 172 formed over and contacting layer 170, third layer 174 formed over and contacting layer 172, and fourth layer 176 formed over and contacting layer 174. Layer 170 can be a protection layer, layer 172 can be a soft FM layer, layer 174 can be a high $\sigma$ metal, and layer 176 can be a protection layer. These four identified layers of electromagnetic shielding structure 150 are each disposed over the entirety of surfaces 142, 144, 154, and 156, and at least a portion of surface 128, in SIP module 148.

Figure 3C:
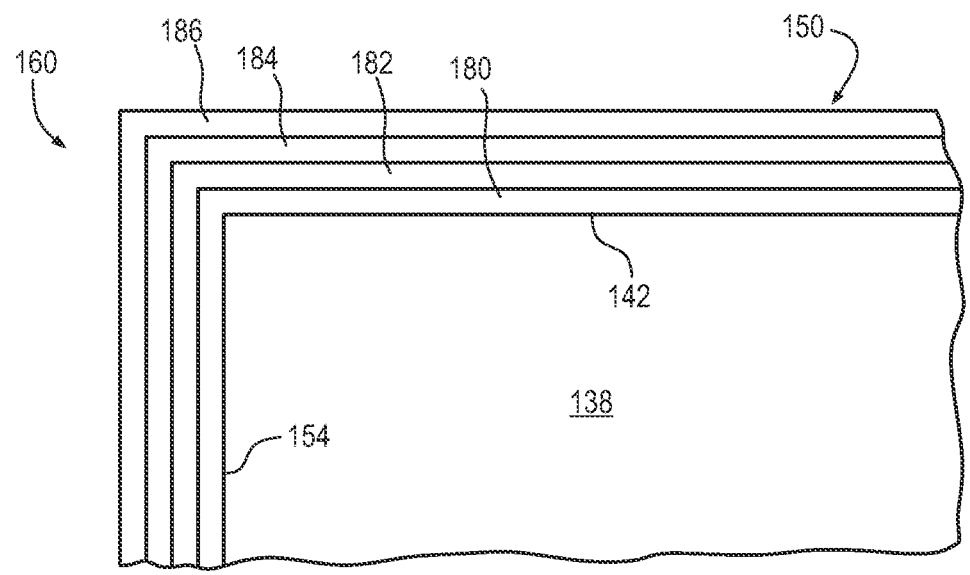

FIG. 3c illustrates a third embodiment of a portion of multi-layer electromagnetic shield 150, in the area indicated by dashed line 160. In the third embodiment, electromagnetic shielding structure 150 has four layers: a first layer 180 formed over and contacting surfaces 142, 144, 154, 156, and 128, second layer 182 formed over and contacting layer 180, third layer 184 formed over and contacting layer 182, and fourth layer 186 formed over and contacting layer 184. Layer 180 can be a protection layer, layer 182 can be a high $\sigma$ metal, layer 184 can be a soft FM layer, and layer 186 can be a protection layer. These four identified layers of electromagnetic shielding structure 150 are each disposed over the entirety of surfaces 142, 144, 154, and 156, and at least a portion of surface 128, in SIP module 148.

Figure 3D:
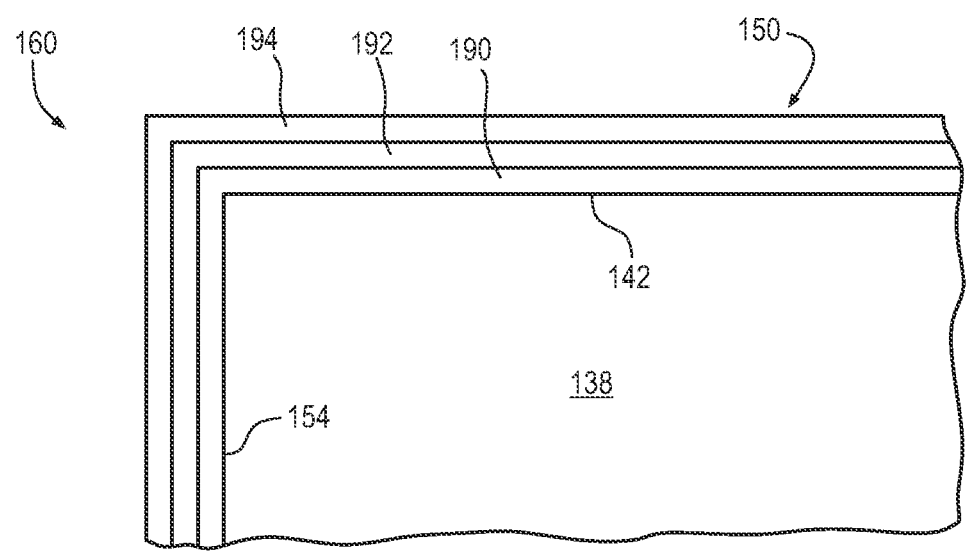

FIG. 3d illustrates a fourth embodiment of a portion of multi-layer electromagnetic shield 150, in the area indicated by dashed line 160. In the fourth embodiment, electromagnetic shielding structure 150 has three layers: a first layer 190 formed over and contacting surfaces 142, 144, 154, 156, and 128, second layer 192 formed over and contacting layer 190, and third layer 194 formed over and contacting layer 192. Layer 190 can be a soft FM layer, layer 192 can be a high $\sigma$ metal, and layer 194 can be a soft FM layer. These three identified layers of electromagnetic shielding structure 150 are each disposed over the entirety of surfaces 142, 144, 154, and 156, and at least a portion of surface 128, in SIP module 148.

Figure 3E:
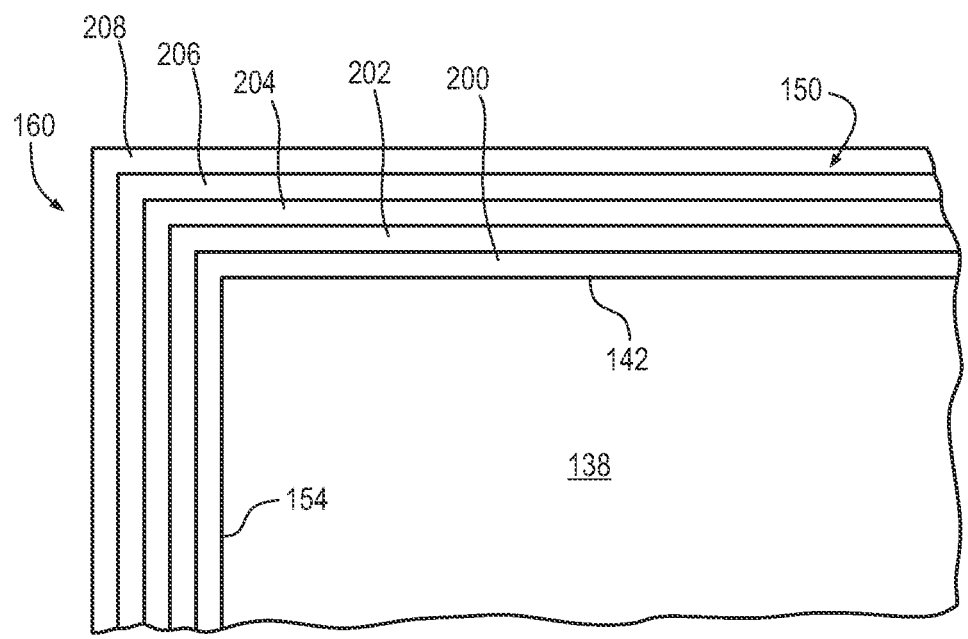

FIG. 3e illustrates a fifth embodiment of a portion of multi-layer electromagnetic shield 150, in the area indicated by dashed line 160. In the fifth embodiment, electromagnetic shielding structure 150 has five layers: a first layer 200 formed over and contacting surfaces 142, 144, 154, 156, and 128, second layer 202 formed over and contacting layer 200, third layer 204 formed over and contacting layer 202, fourth layer 206 formed over and contacting layer 204, and fifth layer 208 formed over and contacting layer 206. Layer 200 can be a soft FM layer, layer 202 can be a high $\sigma$ metal, layer 204 can be a soft FM layer, layer 206 can be a high $\sigma$ metal, and layer 208 can be a soft FM layer. These five identified layers of electromagnetic shielding structure 150 are each disposed over the entirety of surfaces 142, 144, 154, and 156, and at least a portion of surface 128, in SIP module 148.

Figure 3F:
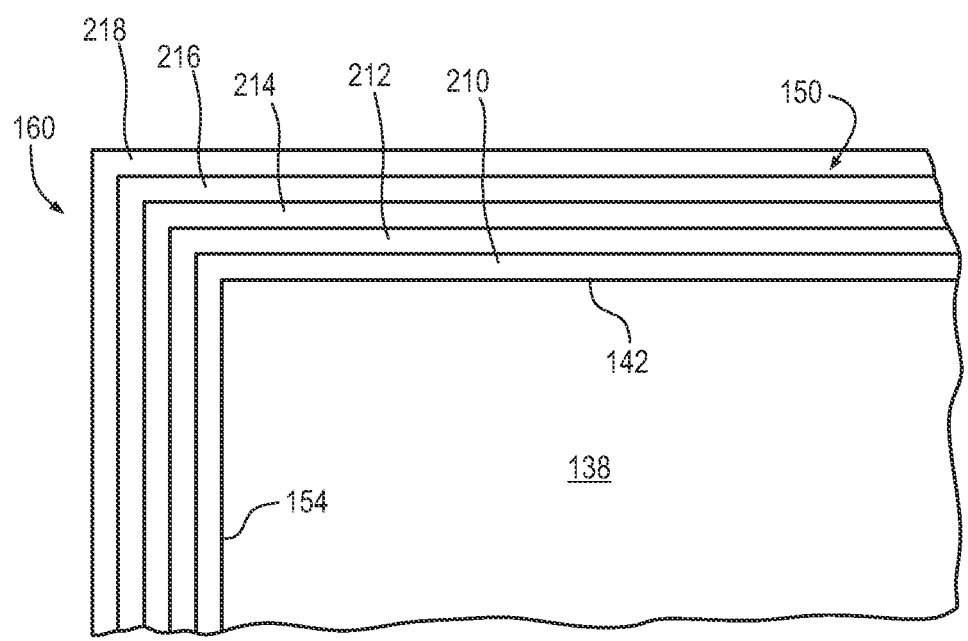

FIG. 3f illustrates a sixth embodiment of a portion of multi-layer electromagnetic shield 150, in the area indicated by dashed line 160. In the sixth embodiment, electromagnetic shielding structure 150 has five layers: a first layer 210 formed over and contacting surfaces 142, 144, 154, 156, and 128, second layer 212 formed over and contacting layer 210, third layer 214 formed over and contacting layer 212, fourth layer 216 formed over and contacting layer 214, and fifth layer 218 formed over and contacting layer 206. Layer 210 can be a protection layer, layer 212 can be a high σ metal, layer 214 can be a soft FM layer, layer 216 can be a high σ metal, and layer 218 can be a protection layer. These five identified layers of electromagnetic shielding structure 150 are each disposed over the entirety of surfaces 142, 144, 154, and 156, and at least a portion of surface 128, in SIP module 148.

Figure 3G:
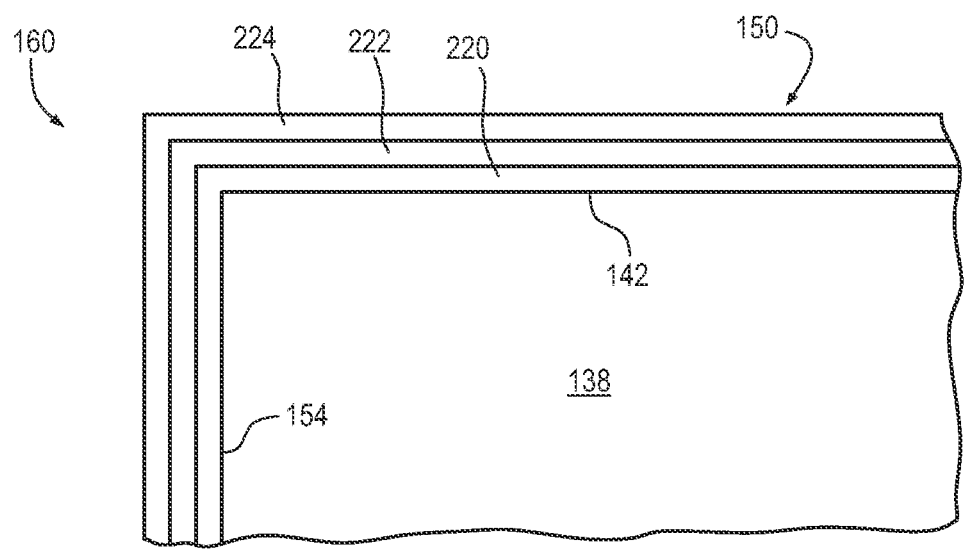

FIG. 3g illustrates a seventh embodiment of a portion of multi-layer electromagnetic shield 150, in the area indicated by dashed line 160 in FIG. 2f. In the seventh embodiment, electromagnetic shielding structure 150 has three layers: a first layer 220 formed over and contacting surfaces 142, 144, 154, 156, and 128, second layer 222 formed over and contacting layer 220, and third layer 224 formed over and contacting layer 222. Layer 220 can be a soft FM layer, layer 222 can be a laminated spacer, and layer 224 can be a soft FM layer. These three identified layers of electromagnetic shield 150 are each disposed over the entirety of surfaces 142, 144, 154, and 156, and at least a portion of surface 128, in SIP module 148.

Figure 4:
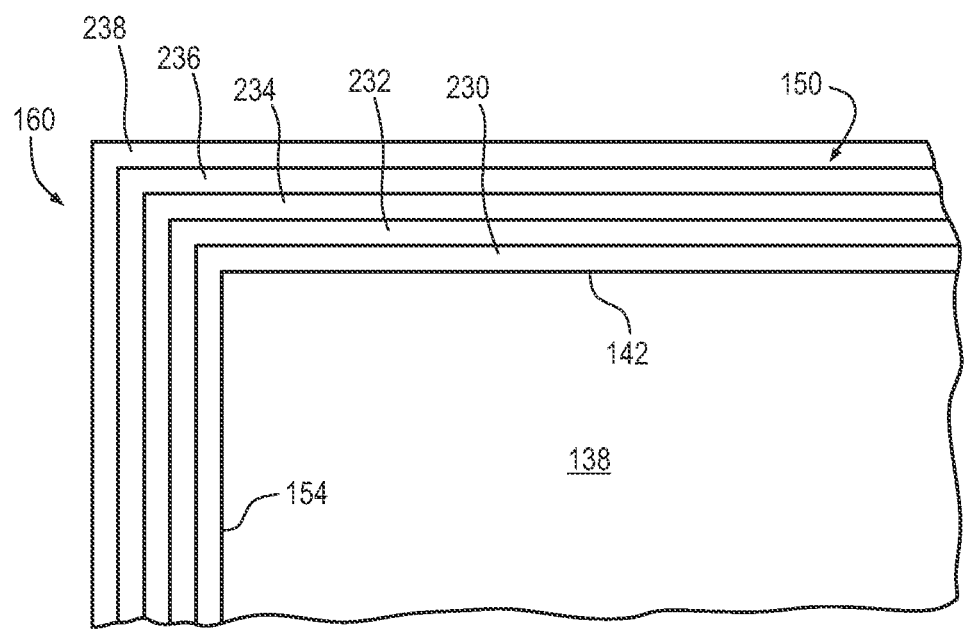
FIG. 4 illustrates a generalized layer-by-layer embodiment of the multi-layer shielding structure.

FIG. 4 illustrates a generalized multi-layer electromagnetic shield 150, in the area indicated by dashed line 160. In the generalized embodiment, electromagnetic shielding structure 150 has a plurality of layers: a first layer 230 formed over and contacting surfaces 142, 144, 154, 156, and 128, second layer 232 formed over and contacting layer 230, third layer 234 formed over and contacting layer 232, fourth layer 236 formed over and contacting layer 234, and fifth layer 238 formed over and contacting layer 236. Layer 230 can be a protection layer, single soft FM layer, or high σ metal. Layer 232 can be a single soft FM layer, laminated spacer layer, or high σ metal. Layer 234 can be a single soft FM layer, laminated spacer layer, or high σ metal. Layer 236 can be a single soft FM layer, laminated spacer layer, or high σ metal. Layer 238 can be a protection layer, single soft FM layer, or high σ metal. In practice, any number of layers of material can be used for electromagnetic shield 150. These above identified layers of electromagnetic shielding structure 150 are each disposed over the entirety of surfaces 142, 144, 154, and 156, and at least a portion of surface 128, in SIP module 148.

SIP module or semiconductor component assembly 148 contains electrical components 130a-130e covered by encapsulant 138 and multi-layer electromagnetic shielding structure 150. SIP module or semiconductor component assembly 148 can be used for mobile communications, automotive, consumer electronics, wifi, bluetooth, touch screen controller, speaker amplifier, power control, flash memory, sensors, microelectromechanical systems (MEMS), Qi-WPC compatible devices, NFC devices, RFID devices, PMA compatible devices, A4WP compatible devices, WCT devices, switching power supplies, inductor modules, and magnetic RAM, as well as electromagnetic noise interference radiated by SIP or high density circuits operating at a high frequency. Each of these devices and applications can generate or be susceptible to high frequency and low frequency interference. High frequency interference is generally above 1.0 GHz, and low frequency interference is below 1.0 GHz. Multi-layer electromagnetic shielding structure 150 is effective for isolating or blocking low frequency interference from low frequency magnetic fields, as well as high frequency interference. In particular, the various multi-layer combinations of protective layer, soft FM layer, and high-σ metal, as described above, protect sensitive devices from low frequency interference, caused by low frequency magnetic fields, by redirecting the magnetic field through the shielding materials and away from the protected device. The various multi-layer combinations of protective layer, soft FM layer, and high-σ metal also protect sensitive devices from high frequency interference.

Figure 5:
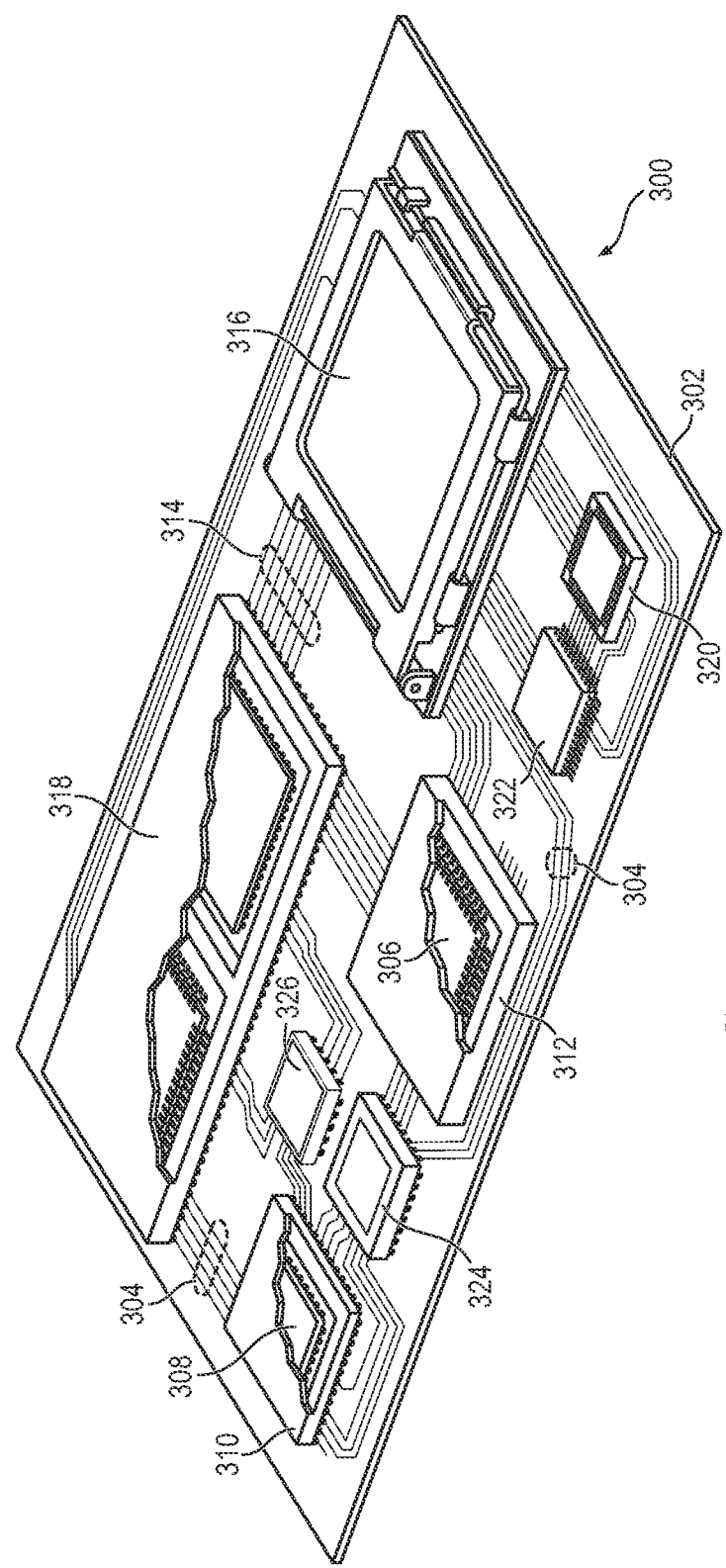
FIG. 5 illustrates a printed circuit board (PCB) with different types of packages mounted to a surface of the PCB.

FIG. 5 illustrates electronic device 300 having a chip carrier substrate or PCB 302 with a plurality of semiconductor packages mounted on a surface of PCB 302, including SIP module 148. Electronic device 300 can have one type of semiconductor package, or multiple types of semiconductor packages, depending on the application.

Electronic device 300 can be a stand-alone system that uses the semiconductor packages to perform one or more electrical functions. Alternatively, electronic device 300 can be a subcomponent of a larger system. For example, electronic device 300 can be part of a tablet, cellular phone, digital camera, communication system, or other electronic device. Alternatively, electronic device 300 can be a graphics card, network interface card, or other signal processing card that can be inserted into a computer. The semiconductor package can include microprocessors, memories, ASIC, logic circuits, analog circuits, RF circuits, discrete devices, or other semiconductor die or electrical components. Miniaturization and weight reduction are essential for the products to be accepted by the market. The distance between semiconductor devices may be decreased to achieve higher density.

In FIG. 5, PCB 302 provides a general substrate for structural support and electrical interconnect of the semiconductor packages mounted on the PCB. Conductive signal traces 304 are formed over a surface or within layers of PCB 302 using evaporation, electrolytic plating, electroless plating, screen printing, or other suitable metal deposition process. Signal traces 304 provide for electrical communication between each of the semiconductor packages, mounted components, and other external system components. Traces 304 also provide power and ground connections to each of the semiconductor packages.

In some embodiments, a semiconductor device has two packaging levels. First level packaging is a technique for mechanically and electrically attaching the semiconductor die to an intermediate substrate. Second level packaging involves mechanically and electrically attaching the intermediate substrate to the PCB. In other embodiments, a semiconductor device may only have the first level packaging where the die is mechanically and electrically mounted directly to the PCB. For the purpose of illustration, several types of first level packaging, including bond wire package 306 and flipchip 308, are shown on PCB 302. Additionally, several types of second level packaging, including ball grid array (BGA) 310, bump chip carrier (BCC) 312, land grid array (LGA) 316, multi-chip module (MCM) or SIP module 318, quad flat non-leaded package (QFN) 320, quad flat package 322, embedded wafer level ball grid array (eWLB) 324, and wafer level chip scale package (WLCSP) 326 are shown mounted on PCB 302. In one embodiment, eWLB 324 is a fan-out wafer level package (Fo-WLP) and WLCSP 326 is a fan-in wafer level package (Fi-WLP). Depending upon the system requirements, any combination of semiconductor packages, configured with any combination of first and second level packaging styles, as well as other electronic components, can be connected to PCB 302. In some embodiments, electronic device 300 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

While one or more embodiments of the present invention have been illustrated in detail, the skilled artisan will appreciate that modifications and adaptations to those embodiments may be made without departing from the scope of the present invention as set forth in the following claims.

What is claimed:

1. A semiconductor device, comprising:
a substrate;
an electrical component disposed over the substrate;
an encapsulant disposed over the substrate and electrical component; and
a multi-layer shielding structure formed over the encapsulant, wherein the multi-layer shielding structure includes:
  (a) a first protection material extending over a top surface and a side surface of the encapsulant where the first protection material is selected from the group consisting of stainless steel, tantalum, molybdenum, titanium, nickel, and chromium,
  (b) a first conductive material in contact with the first protection material where the first conductive material is selected from the group consisting of copper, silver, gold, and aluminum,
  (c) a ferromagnetic material in contact with the first conductive material where the ferromagnetic material is selected from the group consisting of iron, nickel, nickel iron alloy, iron silicon alloy, silicon steel, nickel iron molybdenum alloy, nickel iron molybdenum copper alloy, iron silicon aluminum alloy, nickel zinc, manganese zinc, other ferrites, amorphous magnetic alloy, amorphous metal alloy, and nanocrystalline alloy,
  (d) a second conductive material in contact with the ferromagnetic material where the second conductive material is selected from the group consisting of copper, silver, gold, and aluminum, and
  (e) a second protection material in contact with the second conductive material where the second protection material is selected from the group consisting of stainless steel, tantalum, molybdenum, titanium, nickel, and chromium.

2. A semiconductor device, comprising:
an electrical component assembly; and
a multi-layer shielding structure formed over the electrical component assembly, wherein the multi-layer shielding structure includes:
  (a) a first protection material extending over a top surface and a side surface of the encapsulant where the first protection material is selected from the group consisting of stainless steel, tantalum, molybdenum, titanium, nickel, and chromium,
  (b) a first conductive material in contact with the first protection material where the first conductive material is selected from the group consisting of copper, silver, gold, and aluminum,
  (c) a ferromagnetic material in contact with the first conductive material where the ferromagnetic material is selected from the group consisting of iron, nickel, nickel iron alloy, iron silicon alloy, silicon steel, nickel iron molybdenum alloy, nickel iron molybdenum copper alloy, iron silicon aluminum alloy, nickel zinc, manganese zinc, other ferrites, amorphous magnetic alloy, amorphous metal alloy, and nanocrystalline alloy, and
  (d) a second protection material formed over the ferromagnetic material where the second protection material is selected from the group consisting of stainless steel, tantalum, molybdenum, titanium, nickel, and chromium, and
  (e) a second conductive material in contact with the ferromagnetic material where the second conductive material is selected from the group consisting of copper, silver, gold, and aluminum.

* * * * *